United States Patent
Jin et al.

(10) Patent No.: US 10,234,895 B2
(45) Date of Patent: Mar. 19, 2019

(54) CLOCK SYNTHESIZER WITH HITLESS REFERENCE SWITCHING AND FREQUENCY STABILIZATION

(71) Applicant: Microsemi Semiconductor ULC, Kanata (CA)

(72) Inventors: Qu Gary Jin, Kanata (CA); Chao Zhao, Kanata (CA)

(73) Assignee: Microsemi Semiconductor ULC, Kanata (CA)

( * ) Notice: Subject to any disclaimer, the term of this patent is extended or adjusted under 35 U.S.C. 154(b) by 0 days.

(21) Appl. No.: 15/961,936

(22) Filed: Apr. 25, 2018

(65) Prior Publication Data

US 2018/0329450 A1    Nov. 15, 2018

Related U.S. Application Data

(60) Provisional application No. 62/504,821, filed on May 11, 2017.

(51) Int. Cl.
| | |
|---|---|
| *H03B 21/00* | (2006.01) |
| *G06F 1/12* | (2006.01) |
| *H03L 7/099* | (2006.01) |
| *H03L 7/093* | (2006.01) |
| *H03L 7/07* | (2006.01) |

(52) U.S. Cl.
CPC .............. *G06F 1/12* (2013.01); *H03L 7/07* (2013.01); *H03L 7/093* (2013.01); *H03L 7/0991* (2013.01); *H03L 2207/50* (2013.01)

(58) Field of Classification Search
CPC ........... H03B 21/02; H03B 21/00; H03L 7/16; H03L 7/18; H03L 7/23; G06F 1/08; G06F 1/04; H03K 5/1252; H03K 5/135; H04L 7/0083

USPC ...................................................... 327/105, 99
See application file for complete search history.

(56) References Cited

U.S. PATENT DOCUMENTS

| | | | |
|---|---|---|---|
| 5,740,211 A | 4/1998 | Bedrosian | |
| 6,239,626 B1 * | 5/2001 | Chesavage | G06F 1/08 327/147 |
| 7,551,039 B2 * | 6/2009 | McCoy | H03L 7/085 331/1 A |
| 9,350,367 B2 * | 5/2016 | Ali | H03L 7/22 |
| 9,444,470 B2 | 9/2016 | Milijevic | |
| 2016/0116934 A1 * | 4/2016 | Ha | G06F 1/04 327/298 |
| 2016/0294401 A1 * | 10/2016 | Jin | H03L 7/093 |

OTHER PUBLICATIONS

Anh Pham; Phase Buildout and Hitless Switchover with Digital Phase-Locked Loops (DPLLs); Analog Device Application Note AN-1420; published 2016 by Analog Device, Inc.—Norwood MA.

\* cited by examiner

*Primary Examiner* — Anh Q Tra
(74) *Attorney, Agent, or Firm* — Glass & Associates; Kenneth Glass

(57) ABSTRACT

A clock synthesizer for synthesizing an output clock locked to a selected reference clock input has a pair of phase locked loops locked to respective reference clock inputs first generating first and second frequencies. One of the frequencies is selected to control a controlled oscillator for generating an output clock. The frequency offset between the first and second frequencies at the time of switching is stored and added to the frequency controlling the controlled oscillator.

20 Claims, 4 Drawing Sheets

CLOCK SYNTHESIZER WITH HITLESS REFERENCE SWITCHING AND FREQUENCY STABILIZATION

FIELD OF THE INVENTION

This invention relates to the field of precision timing, and in particular to a method of synthesizing an output clock from a selected one of a plurality of reference clocks with hitless switching between the reference clocks and frequency stabilization, and a clock synthesizer implementing the method.

BACKGROUND OF THE INVENTION

Precision clock synthesis is important in a number of fields. For this purpose, an output clock may be synthesized from a reference clock input tied to some standard reference using a digital phase locked loop (DPLL). In normal operation, the DPLL will synchronize its output clock to the reference clock.

In order to allow for failure or drift of the reference clock, a plurality (two or more) reference clocks are provided. The DPLL is locked to a selected one of them. In the event that the selected reference clock fails or drifts too far, the input of the DPLL is switched to an alternative reference clock.

It is important that switching between the reference clocks occurs smoothly without a phase glitch caused by momentary loss of synchronization. Prior art clock synthesizers are designed to provide what is known as hitless reference switching to ensure a smooth transition between reference clocks.

Where the clock synthesizer is used to provide a stable clock source in certain applications, such as in the dual PLL crystal synchronization circuit described in U.S. Pat. No. 9,444,470, the contents of which are herein incorporated by reference, frequency stabilization can be more important than the mere lack of phase movement that is ensured by hitless switching. In hitless switching, there is no phase or frequency jump at the time of the switching to a new reference clock with slightly different frequency and phase, but the frequency and phase of the output clock will gradually drift to the new frequency and phase determined by the new reference input clock as a result of the inherent properties of the PLL. This frequency drift is unacceptable in applications such as that described in U.S. Pat. No. 9,444,470, where a highly stable clock source whose frequency does not change over time is required. The synthesizer output frequency should remain stable at a constant frequency during and after reference switching even if there is a frequency offset between the two reference clocks, or at the very least should drift to the frequency of the new reference clock at a delayed and potentially settable rate after reference switching. The problem addressed by the invention is how to provide a clock synthesizer that allows for switching between reference clocks while meeting these criteria.

SUMMARY OF THE INVENTION

Embodiments of the invention employ a new architecture for a clock synthesizer wherein the output frequency does not change during and after a reference switch even if there is a frequency offset between the two reference clocks. The output clock locks to the new reference clock but its frequency offset is based on the previous locked reference frequency. The output clock is stable with neither a frequency nor a phase hit. The invention is applicable to crystal applications and frequency stabilization.

According to the present invention there is provided a clock synthesizer for synthesizing an output clock locked to a selected reference clock input, comprising a first phase locked loop for generating a first frequency locked to a first selected reference clock input; a second phase locked loop for generating a second frequency locked to a second selected reference clock input; a controlled oscillator for generating an output clock; a first switch responsive to a switch signal for selecting said first or second frequency to control said controlled oscillator; a frequency tracker for storing a frequency offset between said first and second frequencies at the time of switching said reference clock inputs; and a first adder for adding said frequency offset to said first or second frequency controlling said controlled oscillator.

The clock synthesizer preferably operates in the digital domain, in which case the phase locked loops include software digital controlled oscillators (SDCOs). The reference clock inputs are in this case sampled by phase sampling blocks that produce digital phase values relative to some arbitrary initial phase.

The clock synthesizer can provide hitless reference switching for frequency, and in one non-limiting embodiment, hitless reference switching for phase as well.

In one embodiment the stored offset is gradually attenuated to zero over time while the synthesizer remains locked to a particular reference input.

According to a second aspect of the invention there is provided a method of synthesizing an output clock from to a selected reference clock input, comprising generating a first frequency in a first phase locked loop locked to a first selected reference clock input; generating a second frequency in a second phase locked loop locked to a second selected reference clock input; selecting one of said first or second frequencies to control said controlled oscillator, switching to the other of said first or second frequencies to control said controlled oscillator; storing a frequency offset between said first and second frequencies at the time of switching said reference clock inputs; and adding said stored frequency offset to said first or second frequency controlling said controlled oscillator.

BRIEF DESCRIPTION OF THE DRAWINGS

This invention will now be described in more detail, by way of example only, with reference to the accompanying drawings, in which.

DETAILED DESCRIPTION OF PREFERRED EMBODIMENTS

Figure 1:
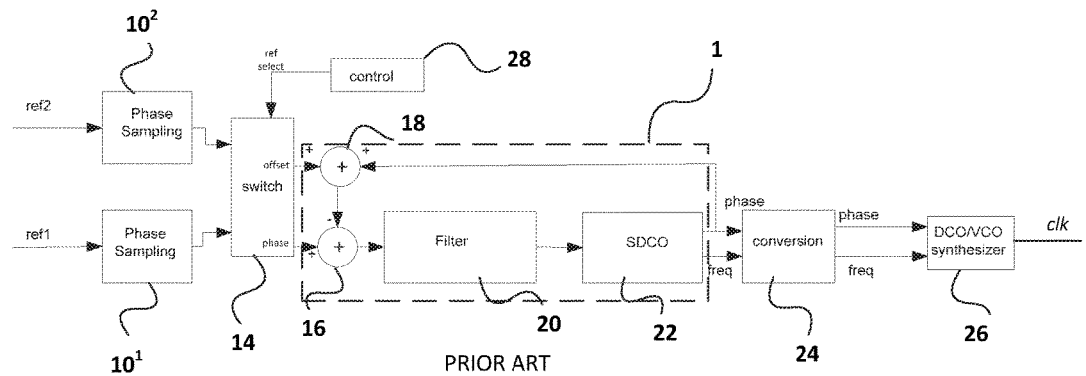
FIG. 1 is a block diagram of a prior art clock synthesizer incorporating a DPLL with reference switching.

The prior art clock synthesizer incorporating a digital phase locked loop (DPLL) 1 shown in FIG. 1 comprises phase sampling blocks $10^1$, $10^2$, which sample respective clock inputs, ref1, ref2, and output digital phase values relative to some initial reference that are input to a switch block 14. It will be appreciated that, being digital, the entire circuit is clocked by a suitable master clock (not shown), and events occur on each master clock cycle.

The switch block 14 outputs a phase value phase based on the currently selected reference clock input and also outputs a stored offset value offset. The phase value phase provides the plus input to phase comparator 16 whose minus input receives the output of adder 18. The phase comparator is shown as an adder with plus and minus inputs. It will be appreciated that an adder with a minus input can be regarded as an adder that adds a negative quantity or a subtractor (comparator). The terms are equivalent.

The output of the phase comparator 16 is input to loop filter 20, which provides the control input to software digital controlled oscillator (SDCO) 22. SDCO 22 outputs digital frequency and phase values locked to the currently selected input reference clock input.

The phase output of the SDCO 22 is fed back to one input of adder 18, the other input of which receives the stored offset value offset. The sum of the offset value and feedback phase provides the minus input of phase comparator 16. The effect of this arrangement is to lock the phase of the phase locked loop to the phase of the currently selected reference clock input plus the offset value offset, which itself can have a negative value.

The phase and frequency values output by the SDCO 22 are converted in a conversion block 24 into suitable inputs for the hardware DCO/VCO synthesizer 26, which generates the output clock clk. For example, the DCO/VCO synthesizer 26 may be in the form of a numerical controlled oscillator, in which case the frequency will be the addend and the phase the number loaded into the accumulator register. In the case of a voltage controlled oscillator the values will be converted into the appropriate control voltages.

The selection of the reference clock input, ref1, ref 2, is controlled by control block 28 via control signal refselect. If the control block 28 detects that the currently selected reference has failed or has drifted to far, it will select a new reference clock input. In order to ensure hitless switching, the switch block 14 will compute the phase difference between the new reference clock input and the old reference clock input and store this value as offset. As a result the DPLL will lock to the new reference with an offset equal to the difference of the phase between the new reference clock input and the old reference clock input, ensuring a smooth transition and thus hitless switching. If there is a frequency offset, the DPLL will gradually lock to the new frequency. This process is repeated each time a reference clock switch occurs.

As noted above, in some applications there is a requirement that both the phase and frequency should be hitless during reference switching. More specifically, the frequency of the DPLL should not lock to the frequency of the new reference clock when the reference switch occurs. This requirement, which cannot be met by the DPLL shown in FIG. 1, can be met by the novel embodiment shown in FIG. 2.

Figure 2:
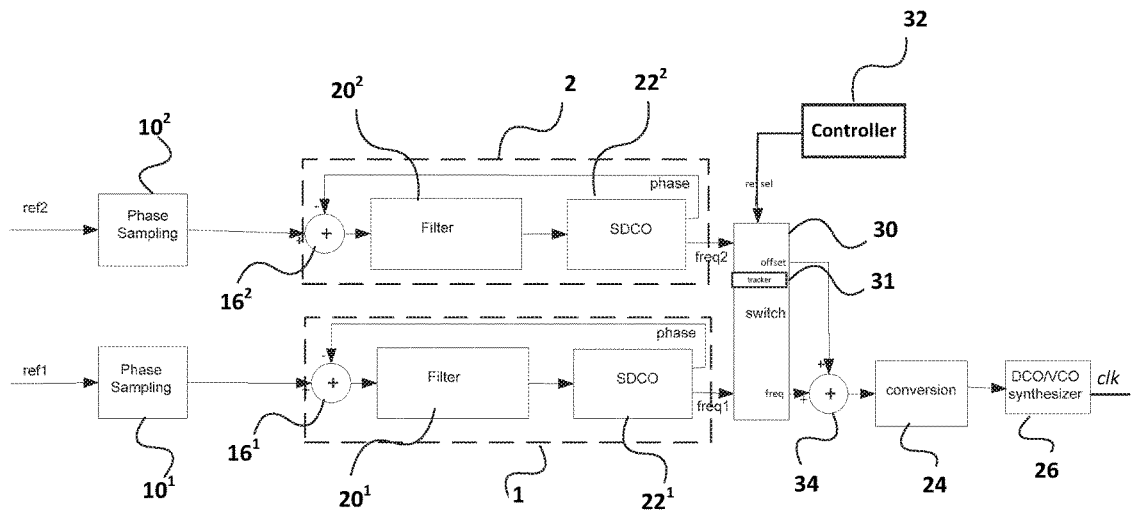
FIG. 2 is a block diagram of a clock synthesizer incorporating a DPLL with reference switching in accordance with a first embodiment of the invention.

The embodiment shown in FIG. 2 operates in the digital domain and comprises two DPLLs 1, 2, each comprising a phase comparator $16^{1,2}$, loop filter $20^{1,2}$ and software digital controlled oscillator (SDCO) $22^{1,2}$, for each input reference clock ref1, ref2. The output of phase sampling block $10^1$, whose input is coupled to input ref1, is fed to the plus input of phase comparator $16^1$ whose minus input receives the phase output of the SDCO $22^1$. The output of phase comparator $16^1$ is fed through loop filter $20^1$ to SDCO $22^1$. Likewise the output of phase sampling block $10^2$, whose input is coupled to input ref2, is fed through phase comparator $16^2$ and loop filter $20^2$ to SDCO $22^2$. The SDCO of each DPLL 1, 2 thus continually outputs a frequency value freq1,freq2, locked to the respective reference clock inputs ref1, ref 2, as long as the reference clock inputs are valid.

The switch block 30 outputs a frequency value freq based on the active DPLL 1, 2 currently selected by the controller 32 dependent on the quality of the input reference clocks.

The controller 32 constantly monitors the quality of the reference clocks inputs. When a reference clock fails or drifts too far, the controller 32 switches the switch 30 so as to pass to the output of switch 30 the DPLL signal associated with the alternative reference clock input. This DPLL then becomes the active DPLL controlling the DCO/VCO synthesizer 26.

It will be understood that in an alternative embodiment the controller 32 could monitor the output frequencies freq1 and freq2 to determine when to initiate a reference switch.

The switch block 30 also includes the tracker block 31, described in more detail with reference to FIG. 3, that monitors the frequencies freq1 and freq2 and stores the frequency offset between the two DPLLs, 1, 2, when switching occurs as the value offset in memory.

The output freq of the switch block 30 is added to the stored value offset from the tracker block 31 in the adder 34 and input to the conversion block 24, which outputs the required frequency control input for the DCO/VCO synthesizer 26, which in turn outputs the output clock clk.

When switching between DPLLs occurs, the output frequency of the DCO/VCO synthesizer 26 becomes locked to the output frequency of the newly active DPLL compensated by the amount offset. As a result there is no jump in frequency during the switch, and the DCO/VCO synthesizer output clk remains stable. This is referred to as frequency build-out. The phase is automatically hitless because in this embodiment the active DPLL 1 or 2 only controls the frequency of the synthesizer.

Figure 3:
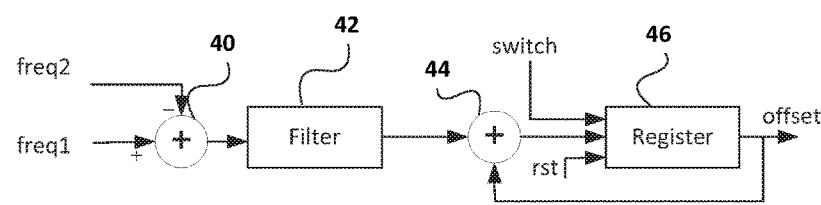
FIG. 3 is a more detailed diagram of the switch block of FIG. 2.

The function of the tracker block 31 is shown in more detail in FIG. 3. The frequency values freq1 and freq2 output by the respective DPLLs are applied respectively to the plus and minus inputs of adder 40 (thereby acting as a subtractor), which therefore subtracts freq2 from freq1 to apply the difference to optional filter 42, which when present averages out wander and jitter. In some applications the filter in the respective DPLL 1, 2 may be sufficient, in which case filter 42 can be eliminated. The output of the filter 42 is applied to the first input of the adder 44 whose second input receives the output of register 46, providing the memory storing the offset frequency value offset.

When the controller 32 initiates a reference clock switch, say from ref1 to ref 2, a signal is asserted on the line switch and the difference freq1−freq2 is added to the current offset value in the register 46. The updated offset value in the register 36 is then applied as the current frequency offset, resulting in a hitless switch in output frequency during the switch of reference clock inputs. When a switch back to the original reference clock occurs, the same process is repeated. If the original reference clock has drifted slightly from its original frequency, there will remain be a small offset value in the register 46 after switching back to the original reference clock since the switch block will maintain the current output frequency of the DCO/VCO synthesizer 26. The initial value in the register 46 can be reset to zero for re-initialization purposes by asserting a reset signal rst.

Figure 4:
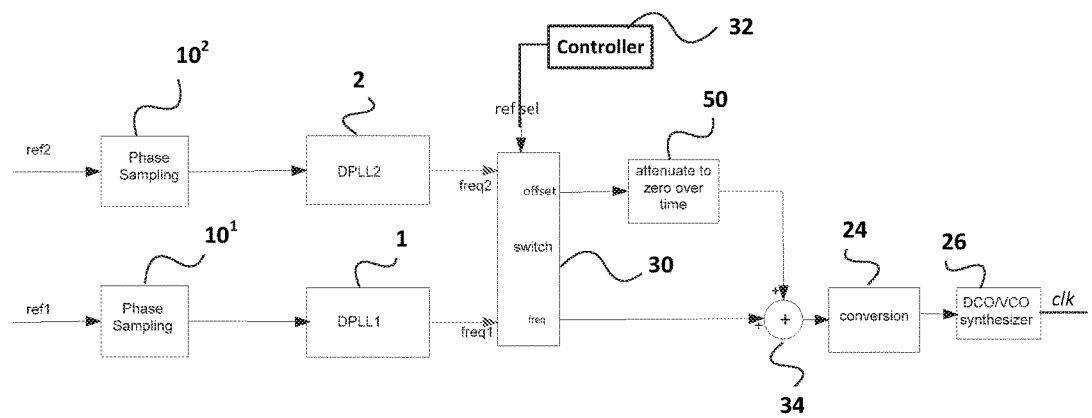
FIG. 4 is a block diagram of a clock synthesizer incorporating a DPLL with reference switching in accordance with a second embodiment of the invention, wherein the frequency offset is gradually attenuated.

The embodiment shown in FIG. 2 maintains the frequency offset while the DCO/VCO synthesizer 26 is locked to the new reference clock via the newly active DPLL. In some cases, it is desirable that the output frequency should be hitless during the reference switch but should eventually follow the frequency of the new reference. The embodiment shown in FIG. 4, which includes an attenuation block 50 between the offset output of switch block 30 and the input to the adder 34, can achieve this. After the references are switched, the offset is gradually attenuated to zero so that the DCO/VCO synthesizer 26 eventually becomes locked to the new reference frequency. This arrangement is extremely flexible and permits the attenuation behavior to be controlled in order to meet different requirements for frequency and phase transition.

Figure 5:
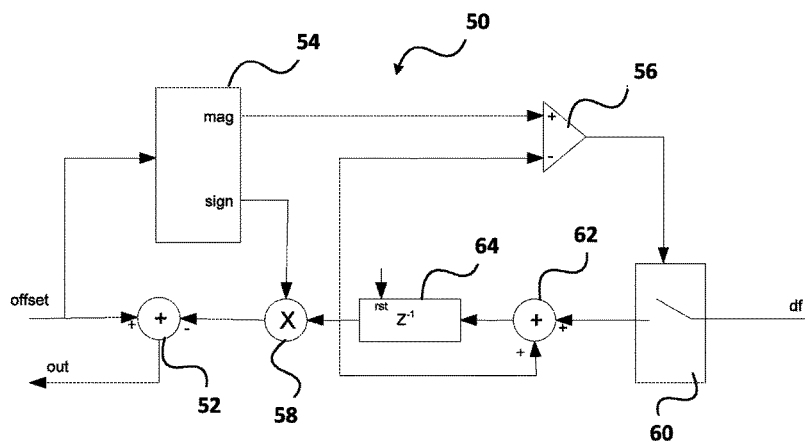
FIG. 5 is a more detailed diagram of the attenuation block shown in FIG. 4.

The attenuation block 50 is shown in more detail in FIG. 5. The value offset is applied to the plus input of adder 52 and to the input of magnitude/sign block 54, which magnitude/sign block 54 outputs the magnitude mag and sign sign of the value offset.

The mag output is applied to the plus input of difference block 56 and the sign output is applied to a first input of multiplier 58. The output of difference block 56 controls switch block 60. The input to switch block 60 is an increment value df which controls the frequency change slope of the output of the clock synthesizer.

The output of switch block 60 is applied to one input of adder 62, whose output is applied to delay memory 64, which introduces a one sample delay. The output of the memory 64 is applied to the second input of multiplier 58, to the second input of adder 62 and to the minus input of difference block 56. The output of multiplier 58 is applied to the minus input of adder 52, and the output of adder 52 contains signal out.

Upon a reference switch the memory 64 is reset to zero via signal rst, and the output out of the block 50 is the same as offset. Initially, there is no frequency change as is the case with the embodiment of FIG. 2.

The switch block 60 adds the increment value df to the adder on each sample or master clock cycle so long as the output of the difference block 56 is non zero. The result is that the output of the memory 64 gradually increments until it reaches the value offset at which point the output of the difference block 56 becomes zero and the switch block 60 ceases to add the increment df.

As the output of the memory 64 increases to offset, the value out gradually decreases to zero. The purpose of the multiplier 58 is to ensure that sign is correct so that the offset is correctly compensated regardless of sign. For example, if the offset is negative, the multiplier 58 will make the output of the memory 64 negative so that in the adder (subtractor) 52 a negative quantity is subtracted from the negative offset to reduce its magnitude.

Figure 6:
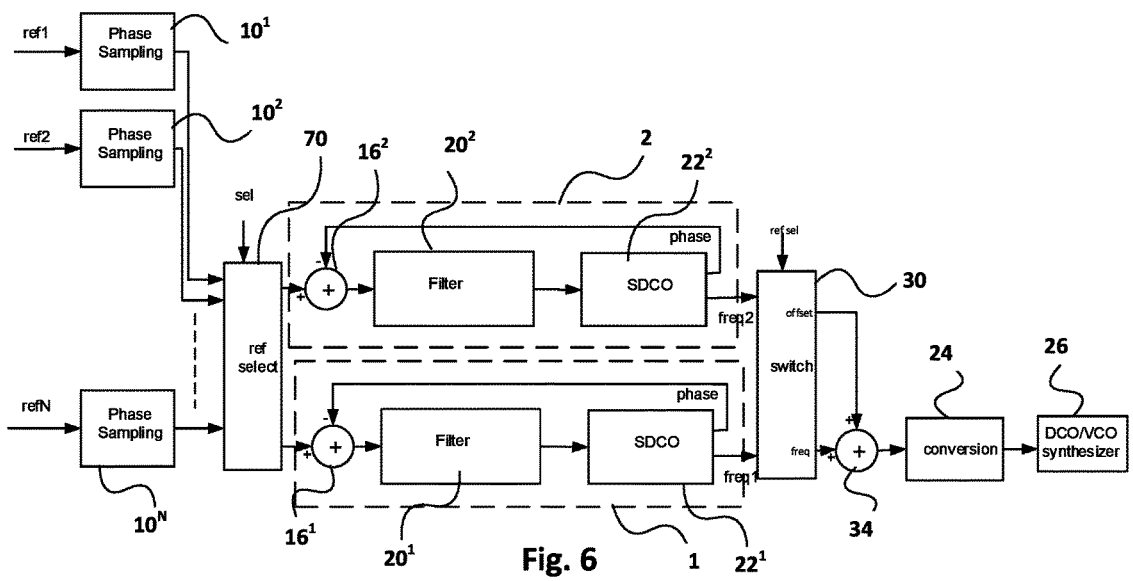
FIG. 6 is a block diagram of a clock synthesizer incorporating a DPLL with reference switching in accordance with a third embodiment of the invention.

The embodiments illustrated so far can be expanded to accommodate multiple reference inputs as shown in FIG. 6. In this embodiment a selector switch block 70 responsive to a selection signal sel is installed downstream of the phase sampling blocks $10^1 \ldots 10^n$. Instead of locking to a specified reference, each of the two DPLLs 1, 2 can lock to any reference clock ref1 . . . refN. If one of the two DPLLs 1, 2 is currently selected as the active DPLL to drive the DCO/VCO synthesizer 26 and this DPLL locks to an input reference clock, the system is locked to this reference clock. This DPLL will not switch to a different reference clock as long as it is selected. If a reference switch is desired responsive to a control circuitry, the other DPLL locks to the new reference to be switched to, responsive to signal sel output by the control circuitry, and the system switches to the newly selected DPLL. This scheme can work either when the reference switch is manually triggered, or automatically triggered by reference failures. This embodiment otherwise works in a manner similar to the embodiment of FIG. 2.

Figure 7:
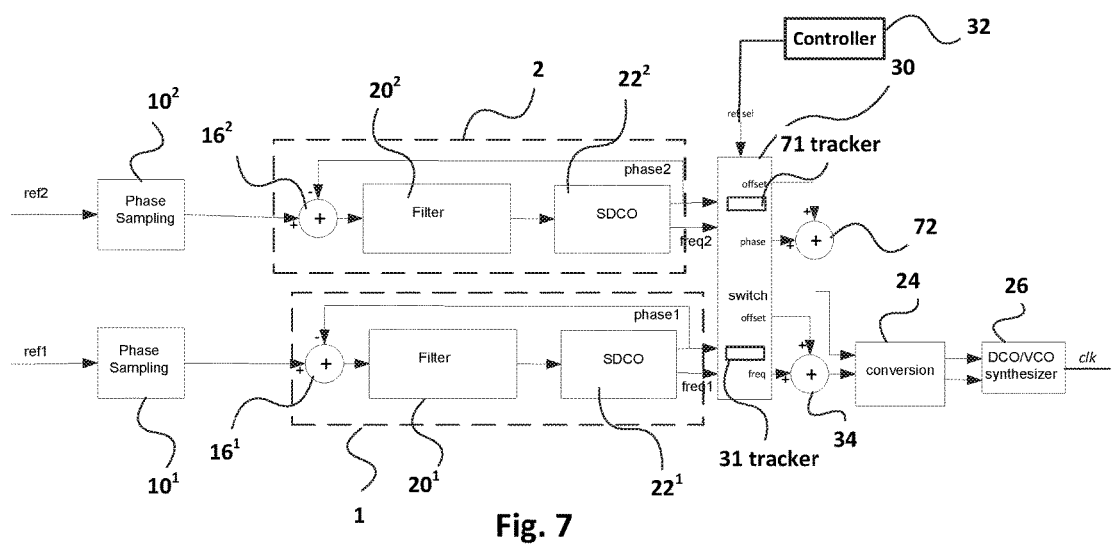
FIG. 7 is a block diagram of a clock synthesizer incorporating a DPLL with reference switching in accordance with a fourth embodiment of the invention.

In some applications, a phase update for the DCO/VCO synthesizer 26 is required to maintain lock because the frequency lock alone may create a small but accumulating phase error when the conversion is not precisely accurate. FIG. 7 shows an embodiment with both phase and frequency build-out.

In the embodiment shown in FIG. 7, both phase and frequency values are applied to the switch block 30 when a reference switch occurs. The frequency offset represents the frequency difference between two references and the phase offset represents the phase difference between two references.

The phase is stored in a second tracker 71 in a manner analogous to the frequency as described with reference to FIG. 3. Second tracker 71 operates in similar manner to FIG. 3 except that phase values are stored instead of the frequency values.

In this case there are two adders, namely adder 34 to add the frequency offset and adder 72 to add the phase offset. The resulting phase and frequency values are the input to conversion block and serve as the phase and frequency control inputs to the DCO/VCO synthesizer 26.

When a reference switch occurs, no phase and frequency hit will occur because the phase and frequency offsets will ensure the phase and frequency of the original reference clock is maintained.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. A clock synthesizer for synthesizing an output clock locked to a selected reference clock input, comprising:
   a first phase locked loop for generating a first frequency locked to a first selected reference clock input;
   a second phase locked loop for generating a second frequency locked to a second selected reference clock input;
   a controlled oscillator for generating the output clock;

a first switch responsive to a switch signal for selecting said first or second frequency to control said controlled oscillator;
a frequency tracker for storing a frequency offset between said first and second frequencies at the time of switching said reference clock inputs; and
a first adder for adding said frequency offset to said first or second frequency controlling said controlled oscillator.

2. The clock synthesizer of claim 1, wherein said frequency tracker comprises:
a first subtractor for outputting the difference between said first and second frequencies;
a register for storing said frequency offset; and
a second adder for adding a stored value in said register to said difference to obtain a new frequency offset, and loading said new frequency offset into said register in response to a switch signal.

3. The clock synthesizer of claim 2, wherein said register has a reset input for resetting the contents of said register to zero.

4. The clock synthesizer of claim 2, further comprising a filter between said first subtractor and said second adder to obtain a long-term average of said difference.

5. The clock synthesizer of claim 1, further comprising an attenuator between said frequency tracker and said first adder for reducing said stored frequency offset to zero over time.

6. The clock synthesizer of 5, wherein said attenuator comprises a delay register for storing a value that gradually increments until it reaches said stored frequency offset, and a second subtractor for offsetting said incrementing value against said stored frequency offset.

7. The clock synthesizer of 6, wherein said attenuator further comprises:
a magnitude/sign block for extracting the magnitude and sign of said stored frequency offset;
a multiplier for multiplying the value stored in said delay register by the extracted sign;
a difference block for extracting the difference between said magnitude and the value stored in said delay register; and
a switch for applying an increment df to the currently stored value in said delay register while the difference between said magnitude and the value stored in said delay register is greater than zero.

8. The clock synthesizer of 7, wherein said switch for applying an increment df to the currently stored value in said delay register is applied to the first input of a third adder whose second input receives the current value stored in said register, and whose output is applied to the input of said register.

9. The clock synthesizer of claim 1, further comprising multiple reference clock inputs, and a reference clock selection switch responsive to a selection signal to couple selected one of said multiple reference clock inputs to said first phase locked loop, and a selected another one of said multiple reference clock inputs to said second phase locked loop.

10. The clock synthesizer of claim 1, wherein:
said first and second phase locked loops output first and second phases;
said first switch includes a phase tracker for storing a phase offset between said first and second phase at the time of switching said reference clock inputs; and
a fourth adder adds said phase offset to said first or second phase to control said controlled oscillator in addition to the output of said first adder.

11. The clock synthesizer of claim 1, wherein said clock synthesizer operates in the digital domain, and said first and second phase locked loops receive said selected reference clock inputs from respective phase sampling blocks and include software digital controlled oscillators providing said first and second frequencies.

12. A method of synthesizing an output clock from a selected reference clock input, comprising:
generating a first frequency in a first phase locked loop locked to a first selected reference clock input;
generating a second frequency in a second phase locked loop locked to a second selected reference clock input;
selecting one of said first or second frequencies to control a controlled oscillator arranged to synthesize the output clock;
switching to the other of said first or second frequencies to control said controlled oscillator;
storing a frequency offset between said first and second frequencies at the time of switching said reference clock inputs; and
adding said stored frequency offset to said first or second frequency controlling said controlled oscillator.

13. The method of claim 12, further comprising filtering the difference between said first and second frequencies to obtain a long-term average prior to storing said frequency offset.

14. The method of claim 12, further comprising periodically resetting the stored frequency offset to zero.

15. The method of claim 12, further comprising gradually attenuating said stored frequency offset to zero over time after switching to the other of said first or second frequencies.

16. The method of claim 15, wherein said attenuating is achieved by subtracting a gradually incrementing value from said stored frequency offset.

17. The method of claim 12, further comprising selecting inputs to said first and second phase locked loops from multiple reference clock inputs in response to a selection signal.

18. The method of claim 12, further comprising:
generating, in addition to said first and second frequencies, first and second phases in said respective first and second phase locked loops, said first phase being associated with said first frequency and being operable to control said controlled oscillator in conjunction with said first frequency, and said second phase being associated with said second frequency and being operable to control said controlled oscillator in conjunction with said second frequency;
storing a phase offset between said first and second phases associated with said respective first and second frequencies at the time of switching said reference clock inputs; and
adding said phase offset to the phase associated with said selected first or second frequency.

19. The method of claim 12, wherein said reference clock inputs are phase sampled to provide inputs to said respective phase locked loops, and said phase locked loops include software digital controlled oscillators providing said generated first and second frequencies.

20. The method of claim 12, wherein the switching between said first and second frequencies occurs in response to monitoring of a quality of said respective reference clock inputs.

* * * * *